United States Patent [19]

Walton

[11] 4,075,420
[45] Feb. 21, 1978

[54] COVER LAYER FOR FLEXIBLE CIRCUITS

[75] Inventor: Tommy L. Walton, Carlsbad, Calif.

[73] Assignee: Burroughs Corporation, Detroit, Mich.

[21] Appl. No.: 608,457

[22] Filed: Aug. 28, 1975

[51] Int. Cl.² .............................................. H01B 7/08
[52] U.S. Cl. ............................ 174/117 F; 174/110 N; 174/117 FF; 428/474; 428/480; 428/414; 428/460; 428/524
[58] Field of Search ............... 428/354, 474, 480, 414, 428/460, 524; 174/96, 110 SR, 110 E, 119 R, 119 C, 117 F, 117 FF, 120 R, 120 C, 120 SR, 129 R, 110 N

[56] References Cited

U.S. PATENT DOCUMENTS

| | | | |
|---|---|---|---|
| 3,202,756 | 8/1965 | Stanback | 174/117 FF |
| 3,206,330 | 9/1965 | Chottiner | 428/524 |
| 3,391,246 | 7/1968 | Freeman et al. | 174/117 FF |
| 3,612,744 | 10/1971 | Thomas | 174/117 FF |
| 3,616,195 | 10/1971 | Rendleman et al. | 428/506 |
| 3,617,969 | 11/1971 | Heinrichs | 428/524 |
| 3,668,058 | 6/1972 | Pappadakis | 428/525 |
| 3,692,924 | 9/1972 | Nye | 174/120 SR |

Primary Examiner—Cameron K. Weiffenbach
Attorney, Agent, or Firm—G. Gregory Schivley; Mervyn L. Young; Kevin R. Peterson

[57] ABSTRACT

A cover layer for flexible circuits which provides increased flexibility. The cover layer encapsulates a flexible circuit having a plurality of spaced conductors on a flexible insulating substrate. The cover layer is a tri-layered laminate having a first layer of insulating film, a second intermediate layer of a thermosetting adhesive, and a third layer of a phenolic resin adhesive. The cover layer is bonded to the flexible circuit with the third layer of phenolic resin adhesive being contiguous the conductors.

7 Claims, 2 Drawing Figures

COVER LAYER FOR FLEXIBLE CIRCUITS

BACKGROUND OF THE INVENTION

This invention relates to flexible circuits. More particularly, it involves a cover layer for flexible circuits which provides increased flexibility therefor.

Flexible circuits have been gaining wide acceptance in industry as a commercially feasible method of making electrical interconnections in a variety of electronic applications. Flexible circuits are flat conductor cables having a plurality of spaced conductors bonded to a flexible insulating film or substrate. It has been generally accepted to provide a cover layer of another similar insulating film to cover or encapsulate the conductors to provide electrical insulation and protection from adverse environmental conditions. Heretofore, the cover layer has been merely an insulating film which has been bonded to the flexible circuits. This has been accomplished, for example, by using a single layer of an adhesive, such as an epoxy adhesive, to bond the insulating film of the cover layer to the conductors on the flexible circuit.

Although the use of flexible circuits has been ever increasing, its use has been limited in those applications which require that the flexible circuit be subjected to repeated bending at extremely acute angles. In such applications it has been found that the conductors of commercially available flexible circuits may snap and break under such conditions thereby resulting in a loss of electrical interconnection.

SUMMARY OF THE INVENTION

Therefore, it is the primary object of this invention to provide a cover layer for a flexible circuit which provides increased flexibility therefor, and which still provides excellent insulation and environmental protection for the flexible circuit.

This and other objects of the invention is accomplished by the use of a unique tri-layered cover layer for the flexible circuits. The cover layer includes a first layer of an insulating film, a second layer of a thermosetting adhesive, and a third layer of a phenolic resin adhesive. In the method of this invention, the cover layer is bonded to the flexible circuit so that the third layer of phenolic resin adhesive is contiguous the conductors on the flexible circuit.

DESCRIPTION OF THE PREFERRED EMBODIMENT

Figure 1:
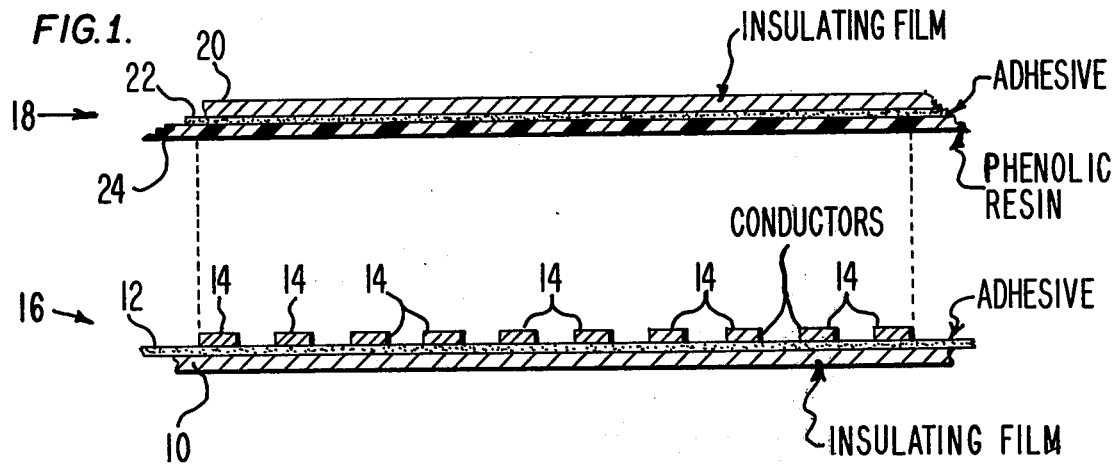
FIG. 1 is a partial cross sectional view showing a flexible circuit and one embodiment of the cover layer of this invention.

Referring now to the drawings, a flexible insulating film approximately 1 to 5 mils thick serves as a substrate 10. Substrate 10 can be of any of the well known insulating films used in flexible circuit technology. In the preferred embodiment, the substrate 10 is a polyimide film distributed by E. I. duPont de Nemours and Company, Inc. under the trademark "Kapton". Other materials which may be used for substrate 10 include polyvinyl chloride, polyolefins such as polyethylene or polypropylene, polytetrafluoroethylene, and the like.

On the upper surface of substrate 10 is a layer of adhesive 12. In the preferred embodiment, adhesive layer 12 is approximately one mil thick and is a modified epoxy adhesive. A modified epoxy adhesive is an adhesive fabricated by combining standard epoxy resins with polyimide or polyamide resins to form a flexible thermosetting adhesive capable of withstanding high temperatures. Other thermosetting adhesives that are well known in the flexible circuit art can also be used, for example, fluorinated ethylene propylene, acrylics, and polyester adhesives.

A plurality of spaced copper conductors 14 are bonded to flexible substrate 10 by the adhesive 12. Typically, the thicknesses of the conductors 14 range from 3 to 70 mils thick, with spacings in the range of approximately 25 mils. It should be noted, however, that the spacing and thicknesses of the conductors 14 may be varied as desired. The conductors 14, adhesive layer 12 and substrate 10 provide an uncovered or unencapsulated flexible circuit 16. The uncovered flexible circuit 16 forms no part of this invention. Consequently, the materials and dimensions can be varied as desired and can be manufactured by known methods in the art. For example, a copper clad laminate can be etched using suitable photolithographic techniques to form the flexible circuit 16 with the spaced conductors 14 as shown in these drawings. A commercially available copper clad laminate such as "Poly-Core EPO31CO3" distributed by Fortin Laminating Corporation of San Fernando, California, includes a continuous or unetched layer of copper which has been bonded to the substrate with a modified epoxy adhesive.

Special attention should now be given to the cover layer generally designated by the numeral 18. Cover layer 18 is a unique tri-layered laminate which provides increased flexibility for the flexible circuit 16. Cover layer 18 includes a first layer 20 of an insulating film. Insulating film layer 20 is preferably a 1 to 3 mils thick Kapton film. Other materials such as those disclosed for substrate 10 may also be used.

An adhesive layer 22 is bonded to the lower surface of insulating film layer 20. Adhesive layer 22 is approximately 1 mil thick and is preferably a modified epoxy adhesive similar to that of adhesive layer 12. As noted hereinbefore, a modified epoxy adhesive is a composite of epoxy and polyimide or polyamide resins. While a modified epoxy adhesive is preferred, other thermosetting adhesives can be used such as those set out as alternatives for adhesive layer 12. For optimum flexibility characteristics, adhesive layer 20 should be a thermosetting adhesive which is flexible, which can be readily laminated to insulating film 20, and which is compatible with the adhesive used to bond the conductors 14 to substrate 10. Consequently, it is advantageous that adhesive layers 12 and 22 be of the same type of adhesive.

An outer third layer 24 is bonded to the lower surface of adhesive layer 22. Layer 24 is approximately 1 mil thick and is a phenolic resin adhesive, preferably a phenolic butyrate adhesive. One commercially available phenolic butyrate adhesive is "Permacell EE-1810" adhesive distributed by Permacell Company. It can be purchased in the form of thin, flexible, cast films or sheets in various sizes. As known in the art the cast film phenolic resin adhesive may include suitable fillers such as wood flour, chopped fabric, glass fibers, etc.

Figure 2:
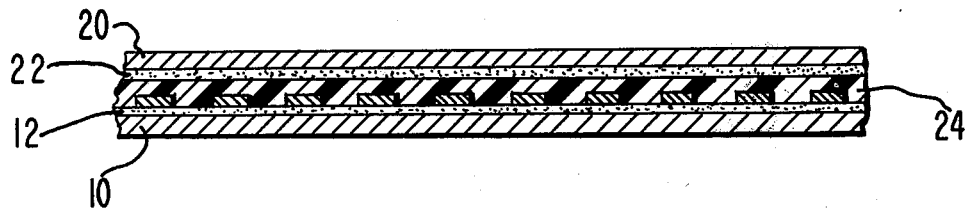
FIG. 2 is a partial cross sectional view showing the cover layer of FIG. 1 bonded to the flexible circuit.

Layers 20, 22, and 24 can be bonded or laminated together to form cover layer 18 which may, in turn, be sold to manufacturers of the flexible circuits. The cover layer 18 can then be shipped to the flexible circuit manufacturer where it is then laminated to the flexible circuit 16 as shown in FIG. 2. However, it is not necessary that the cover layer 18 be bonded together in one operation and then the cover layer subsequently bonded in a different operation to the flexible circuit 16. Instead, it can be accomplished in one bonding process. In such case, a cast film of phenolic resin adhesive is placed over the conductors 14 on flexible circuit 16. The insulating film 20 of the cover layer which has been previously coated with the adhesive layer 22 is then placed on top of the phenolic resin adhesive cast film. This forms a subassembly consisting of the flexible circuit 16, the cast film of phenolic resin adhesive 24, the adhesive layer 22 and the outer insulating film layer 20. This subassembly is then heated to approximately 340° ±10° F, at a pressure applied between insulating film 20 and substrate 10 of about 50–500 pounds per square inch, for a time of about 45–60 minutes. As one particular example, lamination occurs at 340° F at 250 psi for 60 minutes. It should be noted, however, that the times, temperature, and pressure can be varied depending upon the materials used as is well known in the art.

The resultant encapsulated flexible circuit is transparent and has a reddish-orange color. More importantly, the encapsulated flexible circuit using the cover layer of my invention provides increased flexibility over commercially available flexible circuits. The increased flexibility is due to the tri-layered laminated structure of the cover layer 18. The phenolic resin layer 24 provides an intermediate cushion-like stress relief enclosure for the conductors 14 of flexible circuit 16. Consequently, stresses in the conductors are minimized when the flexible circuit undergoes flexure at acute angles thereby preventing the conductors from snapping from the stress.

I have discovered that a single layer of adhesive on cover layer 18 will not provide optimum electrical and mechanical characteristics for the encapsulated flexible circuit. For example, a single layer of an epoxy adhesive becomes too brittle after it has been cured and, therefore, does not provide adequate stress relief. A single layer of a phenolic based adhesive has a tendency to give off gases or outgas during the heating of lamination. This outgassing may produce pin holes or air passages between the cover layer and flexible circuit thereby degrading the hermeticity of the assembly. Consequently, such a cover layer does not provide optimum environmental protection for the flexible circuit. Furthermore, a single layer of a phenolic based adhesive has thermoplastic characteristics when under pressure at temperatures somewhat above room temperature. Under such conditions the phenolic based adhesive softens thereby deteriorating the bond between the cover layer and flexible circuit. This, of course, degrades the stability of the flexible circuit and may in some cases cause the cover layer to peel off of the flexible circuit.

However, the unique tri-layered laminate structure of my invention eliminates the above disadvantages. The phenolic resin adhesive layer is contiguous the conductors and provides stress relief therefor, while the epoxy adhesive layer remains spaced from the conductors. Furthermore, the outgassing of the phenolic resin is substantially eliminated to insure that no pin holes are created between the cover layer and flexible circuit during lamination. Similarly, if the flexible cable is used in optical applications, fogging of the camera lens by such outgassing is eliminated. Moreover, the thermoplastic characteristics of the phenolic resin are reduced to such an extent that the encapsulated flexible circuit can withstand extremely high pressures and temperatures. The reasons for these phenomena are not completely understood. However, it is believed that the epoxy adhesive forms cohesive bonds with the phenolic resin adhesive in such manner to curtail outgassing and softening of phenolic resin layer under the conditions set out above. However, at the same time the cushion-like characteristics of the phenolic resin adhesive remain intact to provide increased flexibility for the flexible circuit.

It should be noted that while this invention has been described in connection with one particular example thereof, no limitation is intended thereby except as defined in the appended claims.

I claim:

1. A cover layer for a flexible circuit having a plurality of spaced conductors on a flexible substrate, said cover layer comprising:
    an outer layer of an insulating polyimide film;
    an intermediate layer of a thermosetting adhesive bonded to said outer layer; and
    an inner layer of a phenolic resin adhesive bonded to said intermediate layer, wherein said cover layer can be subsequently bonded to the flexible substrate with said inner layer being contiguous with said conductors to provide increased flexibility and protection for the flexible circuit.

2. The cover layer of claim 1 wherein the phenolic resin adhesive is a phenolic butyrate adhesive.

3. An encapsulated flexible circuit comprising:
    a flexible substrate;
    a plurality of spaced conductors bonded to said substrate; and
    a tri-layered cover layer bonded to said flexible substrate and covering said conductors, said cover layer having a first outer layer of an insulating film, a second intermediate layer of a thermosetting adhesive, and a third layer of a phenolic resin adhesive contiguous said conductors.

4. The flexible circuit of claim 3 wherein the flexible substrate and insulating film are polyimide films.

5. The flexible circuit of claim 3 wherein the thermosetting adhesive is a modified epoxy adhesive.

6. The flexible circuit of claim 3 wherein the phenolic resin adhesive is a phenolic butyrate adhesive.

7. A cover layer for a flexible circuit having a plurality of spaced conductors on a flexible substrate, said cover layer comprising:
    an outer layer of an polyimide film;
    an intermediate layer of a thermosetting modified epoxy adhesive bonded to said outer layer; and
    an inner layer of a phenolic resin adhesive bonded to said intermediate layer, wherein said cover layer can be subsequently bonded to the flexible substrate with said inner layer being contiguous with said conductors to provide increased flexibility and protection for the flexible circuit.

* * * * *